(12) United States Patent
Hashizume

(10) Patent No.: US 10,477,669 B2
(45) Date of Patent: Nov. 12, 2019

(54) CIRCUIT SUBSTRATE

(71) Applicant: Shimadzu Corporation, Kyoto (JP)

(72) Inventor: Kazuyuki Hashizume, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 16/031,029

(22) Filed: Jul. 10, 2018

(65) Prior Publication Data

US 2019/0021160 A1 Jan. 17, 2019

(30) Foreign Application Priority Data

Jul. 11, 2017 (JP) .................. 2017-135244

(51) Int. Cl.
*H05K 1/02* (2006.01)
*H05K 1/18* (2006.01)
*H05K 1/11* (2006.01)
*H03F 3/45* (2006.01)
*G01K 7/16* (2006.01)

(52) U.S. Cl.
CPC ............. *H05K 1/0201* (2013.01); *G01K 7/16* (2013.01); *H03F 3/45071* (2013.01); *H03F 3/45475* (2013.01); *H05K 1/0209* (2013.01); *H05K 1/111* (2013.01); *H05K 1/181* (2013.01); *H03F 2200/129* (2013.01); *H03F 2203/45116* (2013.01); *H03F 2203/45528* (2013.01); *H03F 2203/45594* (2013.01); *H05K 2201/062* (2013.01); *H05K 2201/10022* (2013.01); *H05K 2201/10151* (2013.01); *H05K 2201/10409* (2013.01); *H05K 2201/10522* (2013.01)

(58) Field of Classification Search
USPC .................................................. 361/767, 720
See application file for complete search history.

(56) References Cited

U.S. PATENT DOCUMENTS

2011/0007225 A1* 1/2011 Kitaguchi ................ H04N 5/64
348/731

FOREIGN PATENT DOCUMENTS

JP 2903005 B 8/1998

* cited by examiner

*Primary Examiner* — Andargie M Aychillhum
(74) *Attorney, Agent, or Firm* — Maier & Maier, PLLC

(57) ABSTRACT

On a circuit board, a metal thin film is formed on a surface 101 of a board body. A linear slit is formed in a metal thin film, so that the metal thin film is separated into a first region and a second region with the slit interposed therebetween. The circuit board 1 includes a heat generation source (for example, an IC) arranged in the first region and an element arranged in the second region. A current flows through the element in a direction parallel to the slit.

7 Claims, 4 Drawing Sheets

CIRCUIT SUBSTRATE

FIELD

The present invention relates to a circuit board having a metal thin film formed on a surface of a board body.

BACKGROUND

An analyzing apparatus, for example, a thermal analyzing apparatus or the like measuring and analyzing a minute signal output from a detector is provided with a circuit board on which an amplifier amplifying the signal from the detector is mounted. Besides the amplifier, various elements such as an electric resistor and a capacitor are mounted on the circuit board.

When each element is mounted on the circuit board, for example, terminals provided in each element are connected to the circuit board by soldering or the like. At this time, since heterogeneous metals are connected to each other, a thermocouple effect occurs at the connection point, and thus, an electromotive force is generated at the connection point as the temperature changes. Such an electromotive force causes noise or drift, and in particular, the influence of the electromotive force cannot be ignored in a detection circuit detecting a minute signal (for example, refer to Patent Literature 1 described later).

In the related art, measures to avoid the occurrence of the above-mentioned electromotive force by performing thermal insulation around the circuit board, temperature control of the board itself, and increasing of the separation distance between the heat generation source and the important component have been taken.

[Patent Literature 1] Japanese Patent No. 2903005

SUMMARY

However, in a case where thermal insulation around the circuit board and temperature control of the board itself are performed, there is a problem that the structure becomes complicated due to addition of components and the apparatus becomes large in size. In addition, there is a problem that the influence of a thermo-electromotive force on a minute signal cannot be sufficiently reduced. In addition, even in a case where the separation distance between the heat generation source and the important component is increased, there is also a problem that the apparatus becomes large in size in the same manner.

The invention has been made in view of the above circumstances, and an object of the invention is to provide a circuit board capable of suppressing influence of an electromotive force due to heat from a heat generation source with a simple configuration. In addition, another object of the invention is to provide a circuit board capable of greatly suppressing influence of an electromotive force due to heat from a heat generation source while preventing an apparatus from becoming large in size.

(1) A circuit board according to the invention is a circuit board where a metal thin film is formed on a surface or an inner layer of a board body, and a linear slit is formed in the metal thin film, so that the metal thin film is separated into a first region and a second region with a slit interposed therebetween. The circuit board includes a heat generation source arranged in the first region and an element arranged in the second region. A current flows through the element in a direction parallel to the slit.

According to such a configuration, since the metal thin film is separated into the first region and the second region by the linear slit, at the time when the heat from the heat generation source reaches the slit from the first region, the heat is uniformized in a linear shape along the slit. Therefore, the heat transferred from the first region to the second region through the slit is transferred to the second region while maintaining the isothermal line parallel to the slit. Accordingly, the direction of the current flowing through the element arranged in the second region is parallel to the isothermal line, so that the influence of the electromotive force due to the thermocouple effect is suppressed.

In this manner, the linear slit is formed in the metal thin film, and the element is arranged so that a current flows in a direction parallel to the slit, so that it is possible to suppress the influence of the electromotive force due to the heat from the heat generation source with a simple configuration. In addition, the first region and the second region are arranged close to each other with the slit interposed therebetween, so that it is possible to greatly suppress the influence of the electromotive force due to the heat from the heat generation source while preventing the apparatus from becoming large in size.

(2) The element may have a pair of connection portions for electrical connection. In this case, it is preferable that the pair of connection portions are aligned in a direction parallel to the slit.

According to such a configuration, the pair of connection portions provided in the element are aligned in a direction parallel to the isothermal line in the second region. For this reason, even in a case where when the connection points of heterogeneous metals are configured by a pair of connection portions, since the connection points thereof are aligned along the isothermal line, so that the influence of the electromotive force due to the thermocouple effect is suppressed.

(3) The element may handle a minute voltage of 20 nV or less. More preferably, the element may handle a minute voltage of 10 nV or less, and furthermore preferably, the element may handle a minute voltage of 1 nV or less.

According to such a configuration, in the element handling a minute voltage, since the influence of the electromotive force due to the thermocouple effect is suppressed, it is possible to prevent the electromotive force from greatly influencing as noise or drift.

(4) The circuit board may further include an amplifier amplifying a signal input through the element.

With such a configuration, since noise or drift can be prevented from influencing a minute signal before being amplified by the amplifier, it is possible to effectively prevent the electromotive force due to the thermocouple effect from greatly influencing as noise or drift.

(5) The heat generation source may be an IC.

According to such a configuration, it is possible to prevent the heat generated from the IC from causing an electromotive force.

(6) The element may be an electric resistor.

According to such a configuration, since the direction of the current flowing through the electric resistor arranged in the second region becomes parallel to the isothermal line, it is possible to prevent the influence of the electromotive force on the electric resistor.

(7) The first region and the second region may be grounded, respectively.

According to such a configuration, since the first region and the second region have a small thermal resistance, the heat from the heat generation source is well uniformized along the slit, and the heat transferred from the first region to the second region through the slit is well transferred to the second region while maintaining the isothermal line parallel to the slit. In addition, the configuration is effective to the inflow of heat from the apparatus housing to the board through the ground point due to a change of the ambient temperature as well as the influence from the heat generation source on the board. In addition, the second region may be connected to the first region after being sufficiently separated in terms of temperature.

According to the invention, a linear slit is formed in a metal thin film, and an element is arranged so that a current flows in a direction parallel to the slit, so that it is possible to suppress influence of an electromotive force due to heat from a heat generation source with a simple configuration. In addition, according to the invention, a first region and a second region are arranged close to each other with a slit interposed therebetween, so that it is possible to greatly suppress an influence of an electromotive force due to heat from a heat generation source while preventing an apparatus from becoming large in size.

BRIEF DESCRIPTION OF THE DRAWINGS

FIG. 3 is a view illustrating a change in an output signal from a circuit board in a case where an input is short-circuited after power is turned on.

DETAILED DESCRIPTION

1. Overall Structure of Circuit Board

Figure 1:
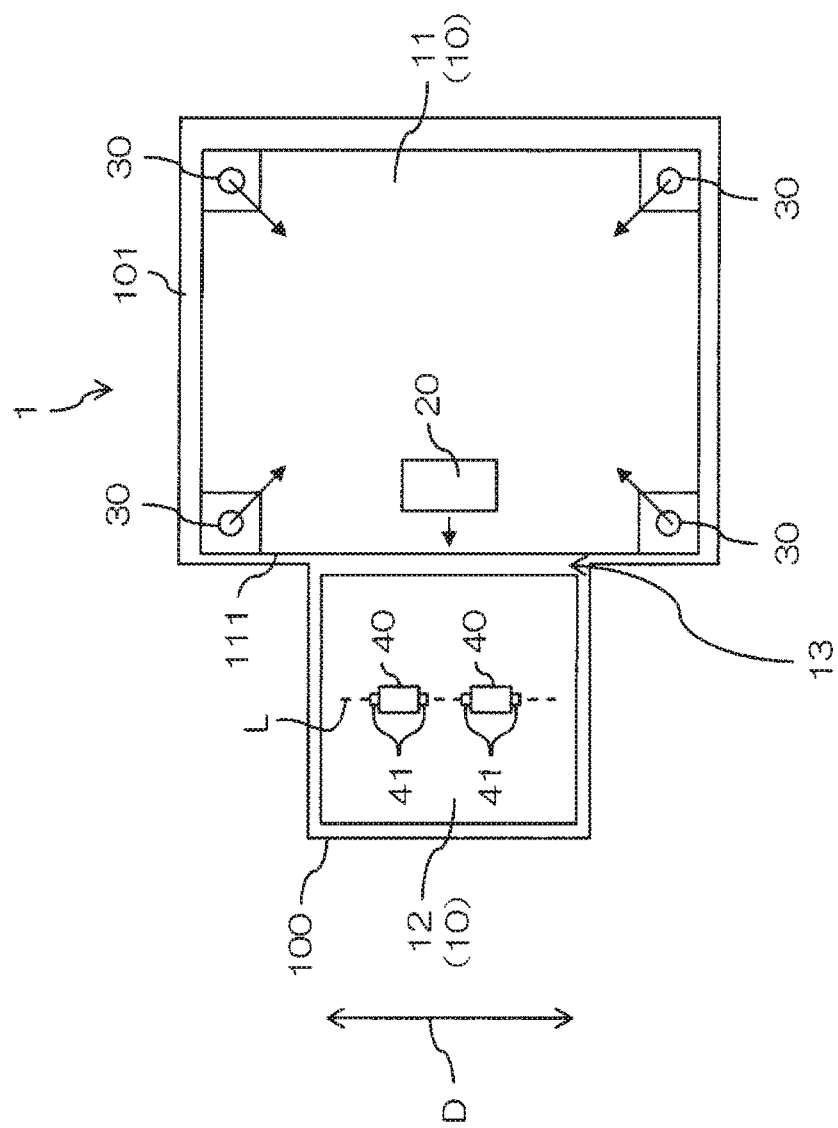
FIG. 1 is a schematic plan view illustrating a configuration example of a circuit board according to an embodiment of the invention.

FIG. 1 is a schematic plan view illustrating a configuration example of a circuit board 1 according to an embodiment of the invention. The circuit board 1 is, for example, a multilayer board configured with a laminate in which a plurality of layers of insulators are laminated. Conductors are formed on both sides of a board body 100 configured with a laminate, and a conductive layer is appropriately formed between the respective insulators inside the board body 100. The circuit board is used, for example, for a thermal analyzing apparatus to constitute a circuit for handling a minute signal output from a detector (not illustrated).

The insulator is a plate-shaped member made of, for example, a resin such as a glass epoxy resin. A through hole is appropriately formed in each insulator, and a conductor is buried in the through hole, so that the conductive layer formed between the respective insulators is electrically conducted, and thus, a desired electric circuit can be configured.

In FIG. 1, one surface 101 of the board body 100 constituting the circuit board 1 is illustrated in a plan view. A metal thin film 10 is formed with a conductive material such as copper on the surface 101 of the board body 100. The metal thin film 10 has a uniform thickness, and various elements constituting the circuit board 1 are arranged on the metal thin film 10. However, the metal thin film 10 is not limited to the configuration where the metal thin film 10 is formed on the surface 101 of the board body 100, and a configuration where the metal thin film 10 is formed in an inner layer (between the laminated insulators) of the board body 100 may be used.

The metal thin film 10 is separated into a first region 11 and a second region 12. More specifically, by forming the slit 13 extending linearly with respect to the metal thin film 10, the first region 11 and the second region 12 are electrically separated with the slit 13 interposed therebetween. A width of the slit 13, that is, a distance between the first region 11 and the second region 12 is, for example, about 1 to several millimeters. In this example, the board body 100 is formed in a rectangular shape having notches at the corners, and the slit 13 are formed so as to extend in parallel to any side of the board body 100. However, the slit 13 may extend in a direction inclined with respect to each side of the board body 100.

The first region 11 is configured to be, for example, a rectangular region, and various electric components such as an integrated circuit (IC) 20 are arranged. In addition, a through hole is formed in at least a portion (four corners in this example) of the first region 11, and the board body 100 is fixed to the fixing position (metal sheet or the like) by a fixing tool 30 such as a screw inserted through the through hole. Electric components such as the IC 20 arranged in the first region 11 and the fixing tools 30 connected to the fixing positions are components that can be heat generation sources, and as indicated by arrows in FIG. 1, heat is transferred from the heat generation sources to the first region 11. The heat generation source is not limited to the IC 20 or the fixing tool 30, and other components that generate heat in accordance with the operation of the apparatus may be the heat generation source.

The second region 12 is configured to be, for example, a rectangular region smaller than the first region 11, and an element 40 such as electric resistor is arranged in the second region. Each element 40 is provided with a pair of connection portions 41, and the connection portions 41 are soldered to lands (not illustrated) formed on the surface 101 of the board body 100, so that electrical connection between heterogeneous metals is performed. The land is electrically separated from the second region 12. Therefore, each element 40 is electrically conducted to the conductive layer formed between the respective insulators in the board body 100, and the element 40 constitutes a portion of the electric circuit.

A pair of connection portions 41 in each element 40 are arranged in a direction parallel to a direction D in which the slit 13 extends. In this example, the connection portions 41 of a plurality (for example, two) of the element 40 are aligned in one straight line along the parallel direction. Accordingly, a current flows through each element 40 in a direction parallel to the direction D in which the slit 13 extends.

However, the second region 12 is not limited to the region having an area smaller than that of the first region 11, and a region having an area equal to that of the first region 11 or an area larger than that of the first region 11 may be used. In addition, the element 40 is not limited to the electric resistor, and other elements in which a current flows in a certain direction may be used. It is preferable that the width of the second region 12 along the slit 13 is equal to or less than the width of the first region 11.

In this embodiment, the first region 11 and the second region 12 are respectively grounded to form a GND layer (solid layer). Since such a first region 11 has a small thermal resistance, the heat generated from the heat generation source on the first region 11 such as the IC 20 and the fixing tool 30 is transferred so as to spread over the entire first region 11, and thus, the heat is uniformized at the boundary with respect to the surface 101 of the board body 100 having a thermal resistance higher than that of the first region 11. For this reason, in a side 111 of the first region 11 closer to the slit 13, the isothermal line extends linearly along the side 111.

The heat from the first region 11 is transferred from the side 111 closer to the slit 13 to the second region 12 through the slit 13 (surface 101 of the board body 100). Therefore, the heat transferred from the first region 11 to the second region 12 through the slit 13 is transferred to the second region 12 while maintaining the isothermal line parallel to the slit 13. Accordingly, in the region where the elements 40 are arranged on the second region 12, an isothermal line L extends parallel to the direction D in which the slit 13 extends as indicated by a broken line in FIG. 1.

2. Specific Circuit Configuration

Figure 2:
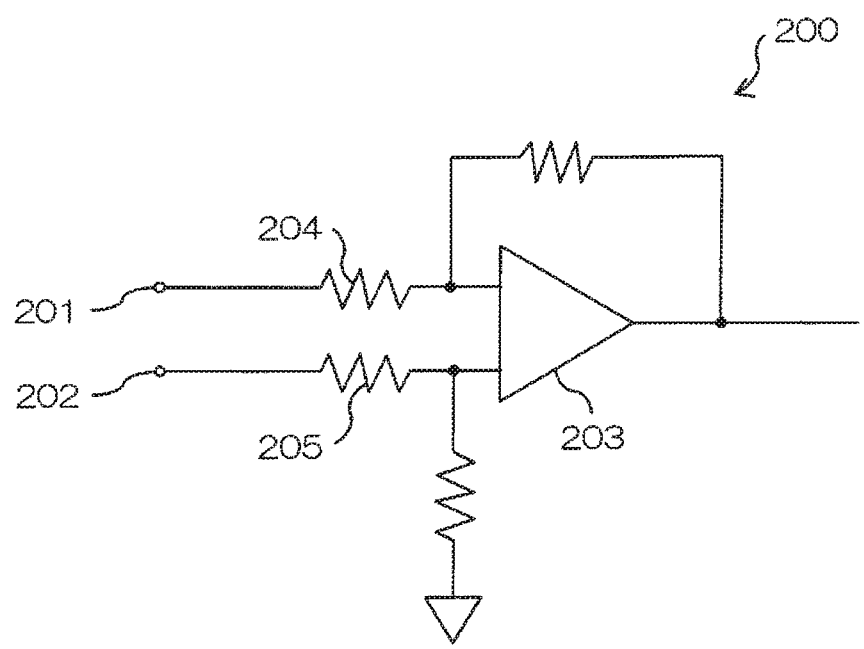
FIG. 2 is a circuit diagram illustrating a portion of an electric circuit provided in a second region.

FIG. 2 is a circuit diagram illustrating a portion of an electric circuit 200 provided in the second region 12. Signals are input from two input units 201 and 202 to the electric circuit 200, and a voltage difference between the input signals is amplified as a differential signal by an amplifier 203. The differential signal before being amplified by the amplifier 203 is a minute voltage of 20 nV or less (more preferably, 10 nV or less, furthermore preferably 1 nV or less).

An electric resistor 204 is connected between one input unit 201 and the amplifier 203. An electric resistor 205 is connected between the other input unit 202 and the amplifier 203. Signals from the input units 201 and 202 are input to the amplifier 203 through the respective electric resistors 204 and 205 to be amplified by the amplifier 203. In this case, each of the electric resistors 204 and 205 is an element which handles a minute voltage of 20 nV or less (more preferably, 10 nV or less and, furthermore preferably, 1 nV or less).

In this example, each of the electric resistors 204 and 205 constitutes each element 40 in FIG. 1. That is, both ends of each of the electric resistors 204 and 205 constitute the connection portions 41 of each element 40 in FIG. 1. By providing each of the electric resistors 204 and 205 in an arrangement like each element 40 illustrated in FIG. 1, a current can flow through each of the electric resistors 204 and 205 in a direction parallel to the direction D in which the slit 13 extends.

3. Experiment Result

Figure 3:
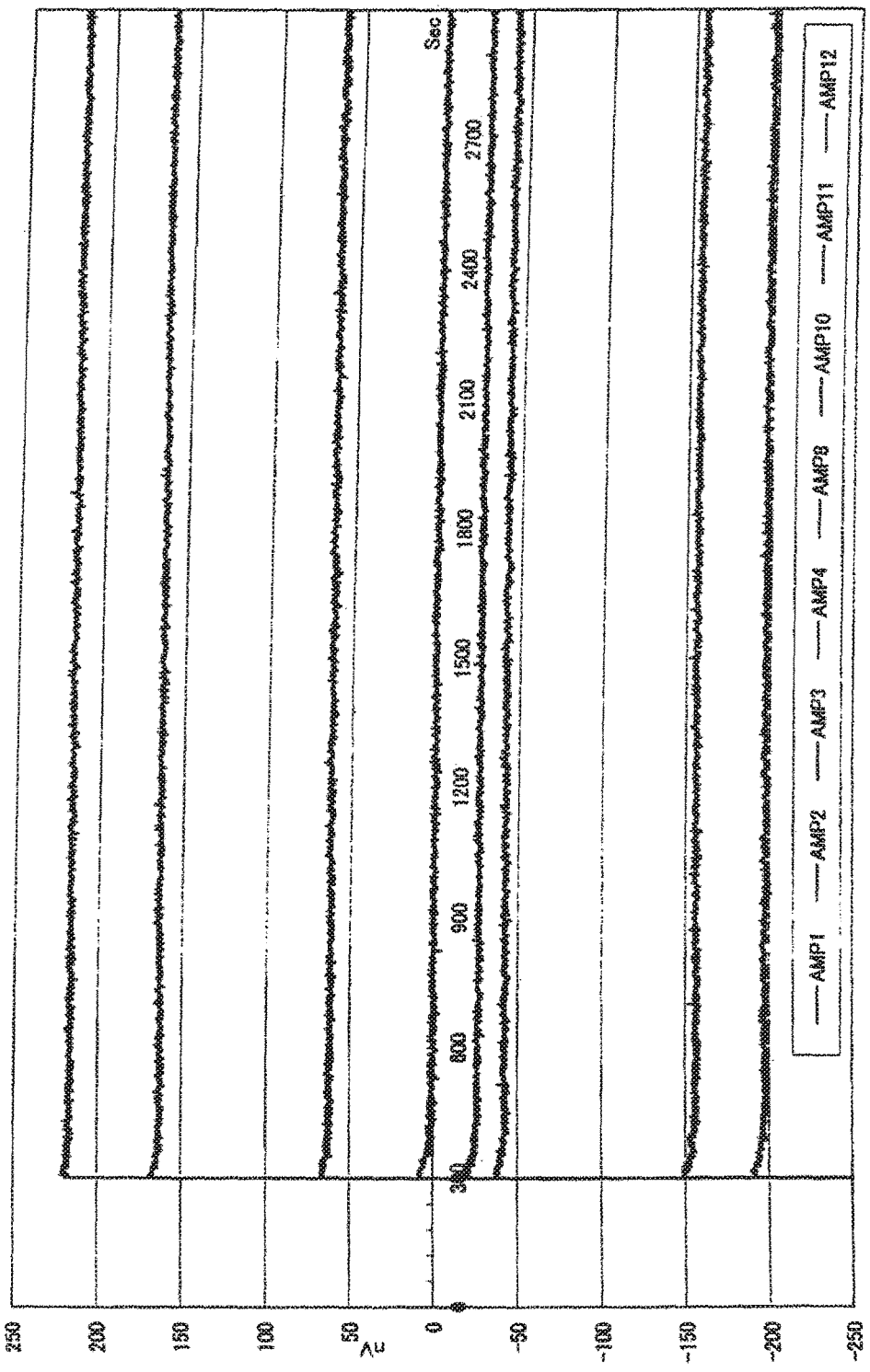

FIG. 3 is a diagram illustrating a change in an output signal from the circuit board in a case where an input is short-circuited after power is turned on. In FIG. 3, eight circuit boards according to the invention are prepared, and results obtained by measuring output signals from the respective circuit boards provided in a thermostatic chamber at 25° C. after power is turned on are illustrated.

According to the measurement results illustrated in FIG. 3, the output signal is stabilized within 1 minute after power is turned on, and a change of the output signal until the stabilization is about 10 nV. In the case of using a circuit board in the related art to which the invention is not applied, it takes two to three hours for the output signal to be stabilized, and the change of the output signal until the stabilization is also about 200 nV. Therefore, it can be understood that, according to the invention, the output signal from the circuit board can be stabilized in a short time, and the change of the output signal can be suppressed.

Figure 4:
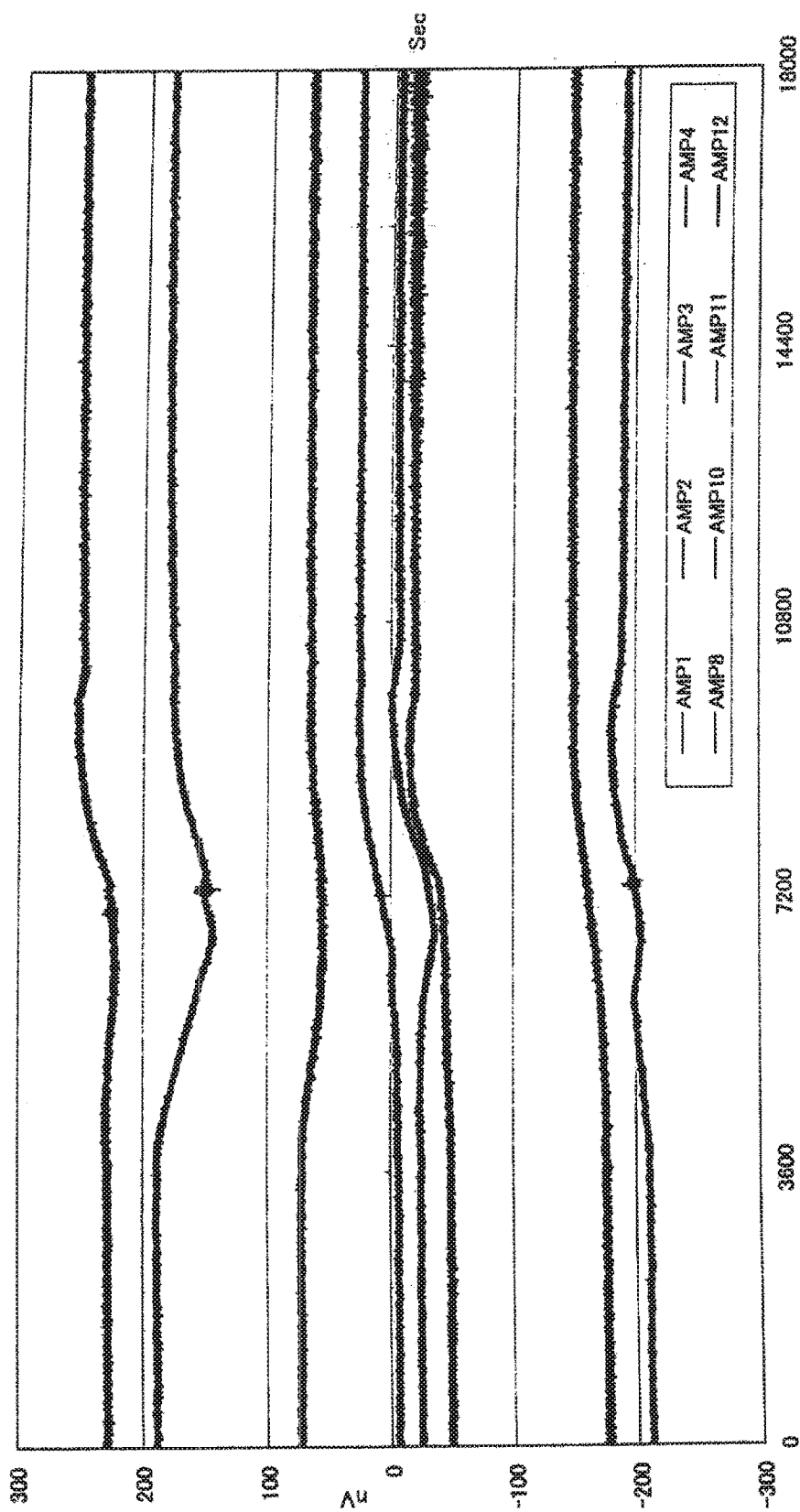
FIG. 4 is a view illustrating a change in an output signal from a circuit board in a case where an ambient temperature is varied in a thermostatic chamber and an input is short-circuited.

FIG. 4 is a view illustrating a change in an output signal from the circuit board in a case where an ambient temperature is varied in a thermostatic chamber and an input is short-circuited. In FIG. 4, eight circuit boards according to the invention are prepared, and results obtained by measuring output signals from the respective circuit boards when the temperature of the thermostatic chamber is stabilized at 5° C. and, after that, the temperature is raised up to 60° C. for one hour are illustrated.

According to the measurement results illustrated in FIG. 4, the change amount of the output signal from the circuit board when the ambient temperature of the circuit board is changed is about 0.8 nV/° C. In the case of using a circuit board in the related art to which the invention is not applied, the change amount of the output signal from the circuit board at the same change of the ambient temperature is about 100 nV/° C. Therefore, it can be understood that, according to the invention, the drift of the output signal from the circuit board can be reduced, and thus, the base line is not easily shifted.

4. Function and Effect (1) In this embodiment, as illustrated in FIG. 1, the metal thin film 10 is separated into the first region 11 and the second region 12 by the linear slit 13. For this reason, at the time when the heat from the heat generation source (IC 20 or the like) reaches the slit 13 from the first region 11, the heat is uniformized in a linear shape along the slit 13 in a side 111 of the first region 11 closer to the slit 13. Therefore, the heat transferred from the first region 11 to the second region 12 through the slit 13 is transferred to the second region 12 while maintaining the isothermal line L parallel to the slit 13. Accordingly, the direction of the current flowing through the element 40 arranged in the second region 12 is parallel to the isothermal line L, so that the influence of the electromotive force due to the thermocouple effect is suppressed.

In this manner, the linear slit 13 is formed in the metal thin film 10, and the element 40 is arranged so that a current flows in a direction parallel to the slit 13, so that it is possible to suppress the influence of the electromotive force due to the heat from the heat generation source with a simple configuration. In addition, the first region 11 and the second region 12 are arranged close to each other with the slit 13 interposed therebetween, so that it is possible to greatly suppress the influence of the electromotive force due to the heat from the heat generation source while preventing the apparatus from becoming large in size.

(2) In this embodiment, as illustrated in FIG. 1, a pair of connection portions 41 provided in each element 40 are arranged in a direction parallel to the isothermal line L in the second region 12. Therefore, even in a case where the connection points of heterogeneous metals are configured by a pair of the connection portions 41, the connection points thereof are arranged along the isothermal line L, so that the influence of the electromotive force due to the thermocouple effect is suppressed.

(3) In particular, in this embodiment, in the element 40 that handles a minute voltage of 20 nV or less (more preferably 10 nV or less, furthermore preferably 1 nV or less), since the influence of the electromotive force due to the thermocouple effect is suppressed, it is possible to prevent the electromotive force from greatly influencing as noise or drift.

(4) In addition, in this embodiment, as illustrated in FIG. 2, since noise or drift can be prevented from influencing a minute signal (differential signal) before being amplified by the amplifier 203, it is possible to effectively prevent the electromotive force due to the thermocouple effect from greatly influencing as noise or drift.

(5) In this embodiment, as illustrated in FIG. 1, it is possible to prevent the heat generated from the IC 20 as a heat generation source from causing an electromotive force.

(6) In addition, in this embodiment, as illustrated in FIGS. 1 and 2, since the direction of the current flowing through the electric resistors 204 and 205 as the element 40 arranged in the second region 12 becomes parallel to the isothermal line L, it is possible to prevent the influence of electromotive force on the electric resistors 204 and 205.

(7) In addition, in this embodiment, since the first region 11 and the second region 12 which are respectively grounded have a small thermal resistance, the heat from the heat generation source is well uniformized along the slit 13, and the heat transferred from the first region 11 to the second region 12 through the slit 13 is well transferred to the second region 12 while maintaining the isothermal line L parallel to the slit 13.

5. Modified Example

In the above-described embodiment, the configuration where the metal thin film 10 is separated into two regions, that is, the first region 11 and the second region 12 with one slit 13 has been described. However, the invention is not limited to such a configuration. For example, by forming two or more slits 13, the metal thin film 10 may be separated into three or more regions.

The board body 100 of the circuit board 1 is not limited to the multilayer board, and for example, a single layer board may be used. In addition, the circuit board 1 according to the invention can be applied to other various apparatuses in addition to the thermal analyzing apparatus.

The invention claimed is:

1. A circuit board comprising:
   a board body;
   a metal film formed on a surface or an inner layer of the board body;
   a linear slit formed in the metal film so that the metal film is separated into a first region and a second region with the slit interposed therebetween;
   a heat generation source arranged in the first region; and
   an element arranged in the second region and through which a current flows in a direction parallel to the slit,
   wherein heat from the heat generation source is transferred from the first region to the second region in an isothermal line parallel to the slit.

2. The circuit board according to claim 1, wherein the element has a pair of connection portions for electrical connection, and wherein the pair of connection portions are aligned in the direction parallel to the slit.

3. The circuit board according to claim 1, wherein the element handles a minute voltage of 20 nV or less.

4. The circuit board according to claim 1, further comprising an amplifier amplifying a signal input through the element.

5. The circuit board according to claim 1, wherein the heat generation source is an integrated circuit.

6. The circuit board according to claim 1, wherein the element is an electric resistor.

7. The circuit board according to claim 1, wherein the first region and the second region are grounded.

* * * * *